United States Patent
Ohtsuki et al.

(10) Patent No.: US 12,387,126 B2
(45) Date of Patent: Aug. 12, 2025

(54) METHOD FOR PRODUCING SEMICONDUCTOR APPARATUS FOR QUANTUM COMPUTER

(71) Applicant: SHIN-ETSU HANDOTAI CO., LTD., Tokyo (JP)

(72) Inventors: Tsuyoshi Ohtsuki, Annaka (JP); Hiroshi Takeno, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 427 days.

(21) Appl. No.: 18/014,221

(22) PCT Filed: May 26, 2021

(86) PCT No.: PCT/JP2021/019893
§ 371 (c)(1),
(2) Date: Jan. 3, 2023

(87) PCT Pub. No.: WO2022/024526
PCT Pub. Date: Feb. 3, 2022

(65) Prior Publication Data
US 2023/0276716 A1  Aug. 31, 2023

(30) Foreign Application Priority Data
Jul. 29, 2020  (JP) ................... 2020-128609

(51) Int. Cl.
*G06N 10/40* (2022.01)
*H01L 21/263* (2006.01)
(Continued)

(52) U.S. Cl.
CPC ........... *G06N 10/40* (2022.01); *H01L 21/263* (2013.01); *H01L 21/3221* (2013.01); *H01P 3/003* (2013.01)

(58) Field of Classification Search
CPC ..................................................... G06N 10/40
See application file for complete search history.

(56) References Cited

U.S. PATENT DOCUMENTS

| | | | |
|---|---|---|---|
| 10,068,184 | B1 | 9/2018 | Hertzberg et al. |
| 2011/0121895 | A1 | 5/2011 | Morello et al. |

(Continued)

FOREIGN PATENT DOCUMENTS

| | | |
|---|---|---|
| JP | S51-093684 A | 3/1976 |
| JP | S51-093666 A | 8/1976 |

(Continued)

OTHER PUBLICATIONS

Hornibrook, J.M. et al., "Frequency Multiplexing for Readout of Spin Qubits," Applied Physics Letters, vol. 104, No. 10, Dec. 18, 2013, 4 pages.

(Continued)

*Primary Examiner* — Matthew L Reames
(74) *Attorney, Agent, or Firm* — Oliff PLC

(57) ABSTRACT

A method produces a semiconductor apparatus for a quantum computer. The apparatus includes: a semiconductor substrate; a quantum computer device formed on the semiconductor substrate; and a peripheral circuit formed on the semiconductor substrate and connected to the quantum computer device. The apparatus is to be used as a quantum computer. The method includes: a step of forming the quantum computer device and the peripheral circuit on the semiconductor substrate; and a step of deactivating a carrier in the semiconductor substrate by irradiation of a particle beam to at least a formation part for the quantum computer device and a formation part for the peripheral circuit in the semiconductor substrate. The method for producing a semiconductor apparatus for a quantum computer can produce a (Continued)

semiconductor apparatus for a quantum computer having excellent 3HD characteristics.

12 Claims, 10 Drawing Sheets

(51) Int. Cl.
  *H01L 21/322* (2006.01)
  *H01P 3/00* (2006.01)

(56) References Cited

U.S. PATENT DOCUMENTS

| | | | |
|---|---|---|---|
| 2019/0165238 A1 | 5/2019 | Rosenblatt et al. | |
| 2020/0091608 A1 | 3/2020 | Alpman et al. | |
| 2021/0343785 A1 | 11/2021 | Nakamura et al. | |

FOREIGN PATENT DOCUMENTS

| | | |
|---|---|---|
| JP | S51-100644 A | 9/1976 |
| JP | H10-093107 A | 4/1998 |
| JP | 2005-093939 A | 4/2005 |
| JP | 2011-512525 A | 4/2011 |
| JP | 2015-115404 A | 6/2015 |
| JP | 2020-507230 A | 3/2020 |
| JP | 2020-061447 A | 4/2020 |
| WO | 2019/081970 A1 | 5/2019 |
| WO | 2019/105716 A1 | 6/2019 |

OTHER PUBLICATIONS

Aug. 9, 2024 extended Search Report issued in European Patent Application No. 21851363.8.
Jul. 20, 2021 International Search Report issued in International Patent Application No. PCT/JP2021/019893.
Jan. 31, 2023 International Preliminary Report on Patentability issued in International Patent Application No. PCT/JP2021/019893.
Rosenberg, D. et al. "3D Integrated Superconducting Qubits". npj Quantum Information, 3, 42 (2017).
Dr. Ramian, F. "Measurement of Harmonics Using Spectrum Analyzers". Rohde & Schwarz Application Note, Feb. 2012, 1EF78_1E, pp. 1-13.
Apr. 21, 2025 Office Action issued in Korean Patent Application No. 10-2022-7046223.

[FIG. 1]
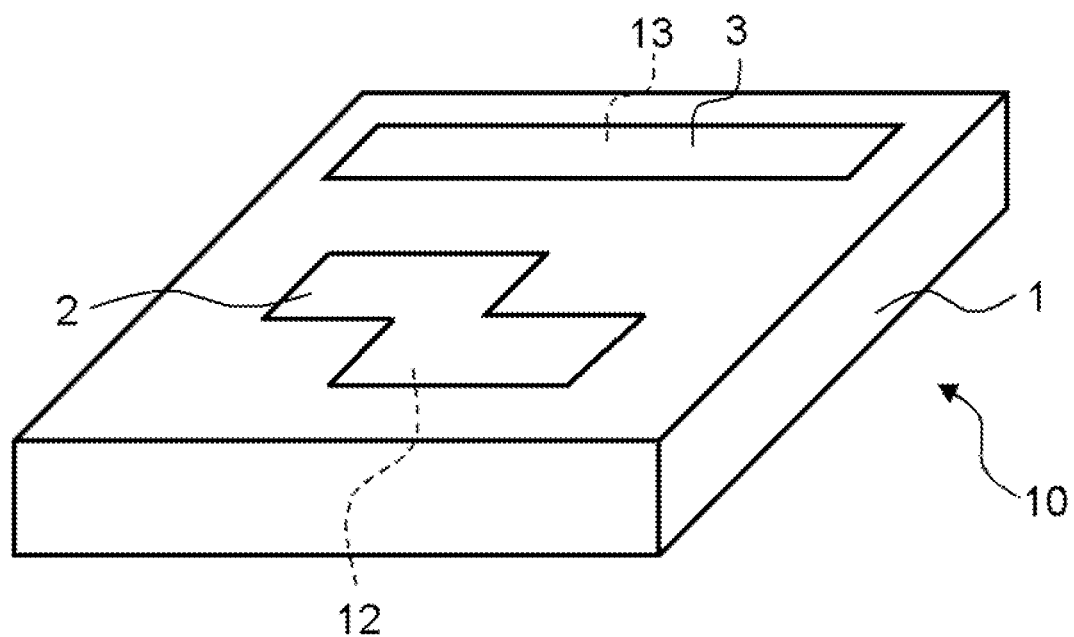

[FIG. 2]
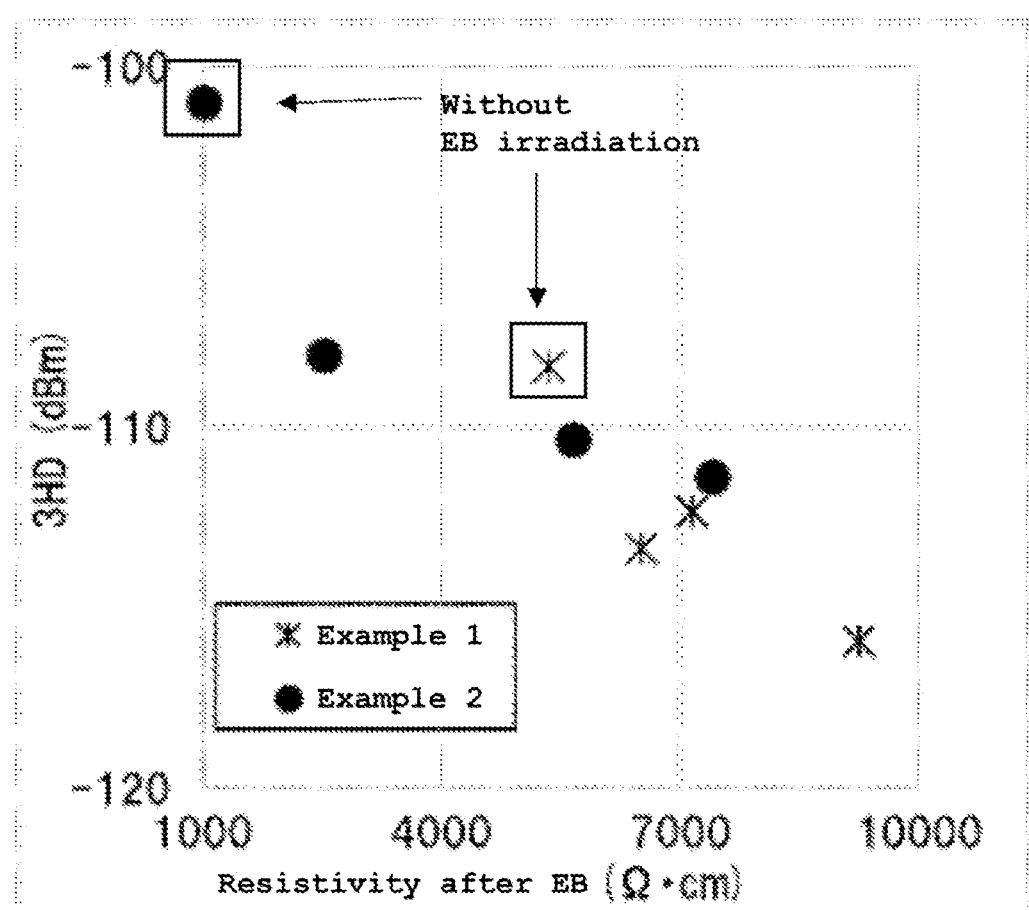

[FIG. 3]
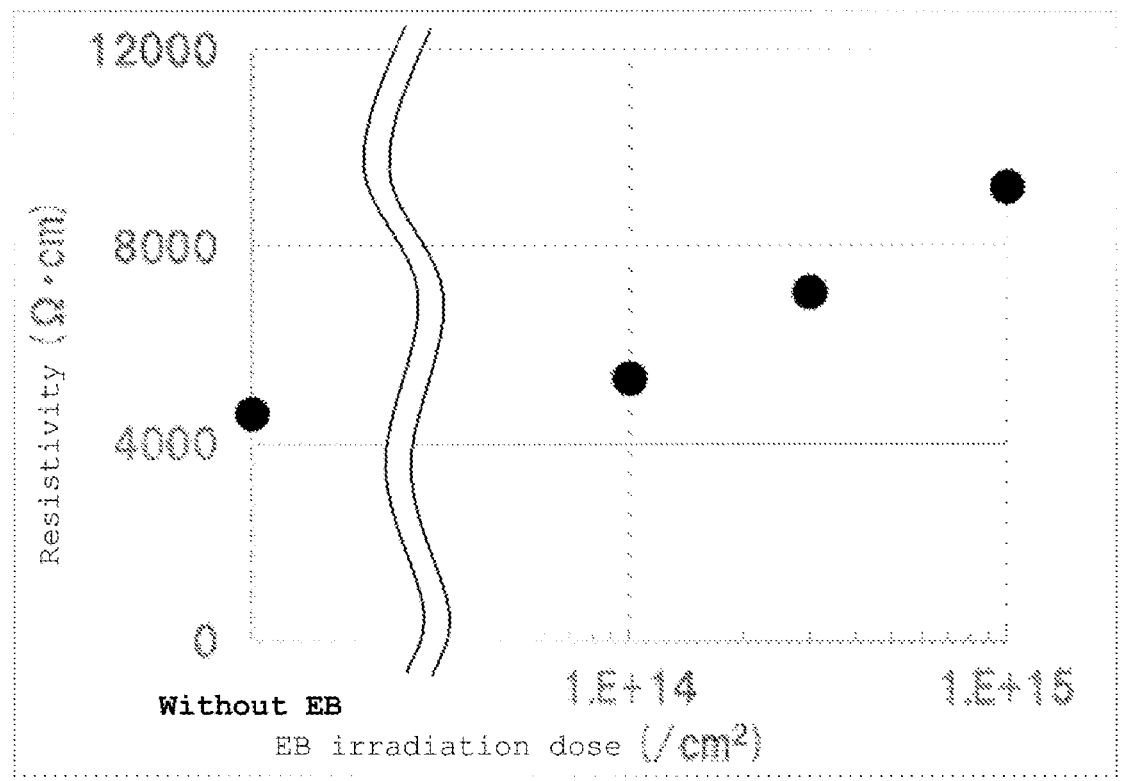

[FIG. 4]
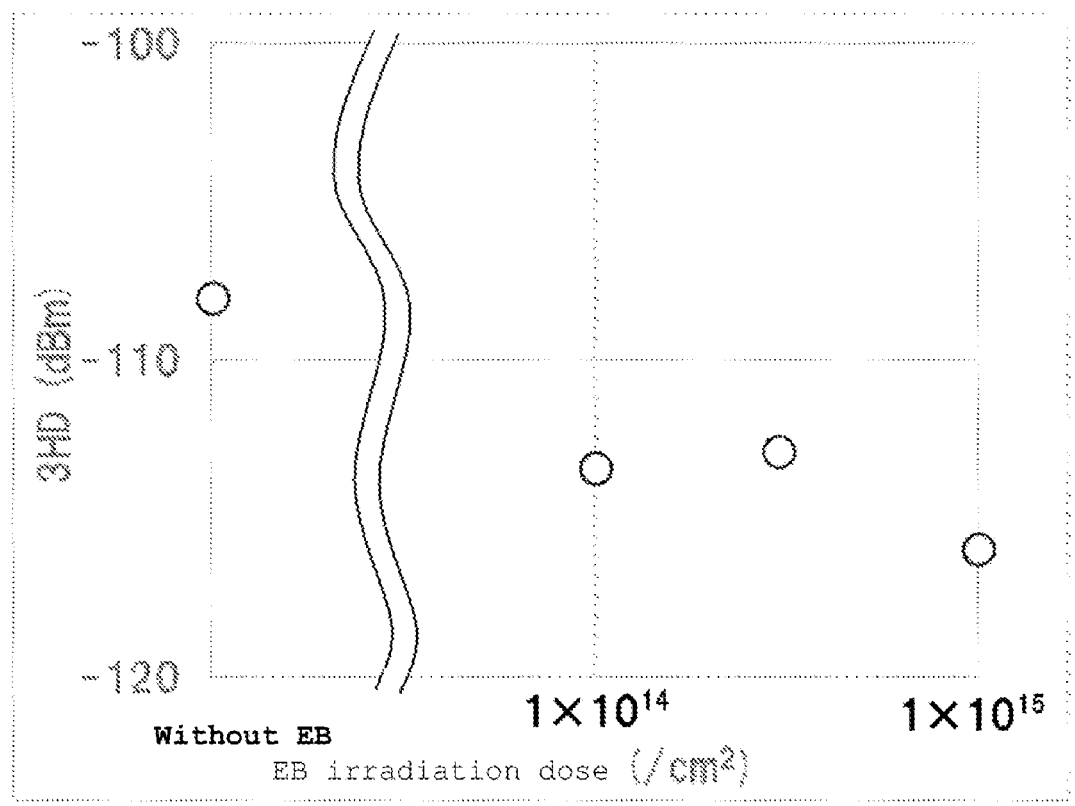

[FIG. 5]
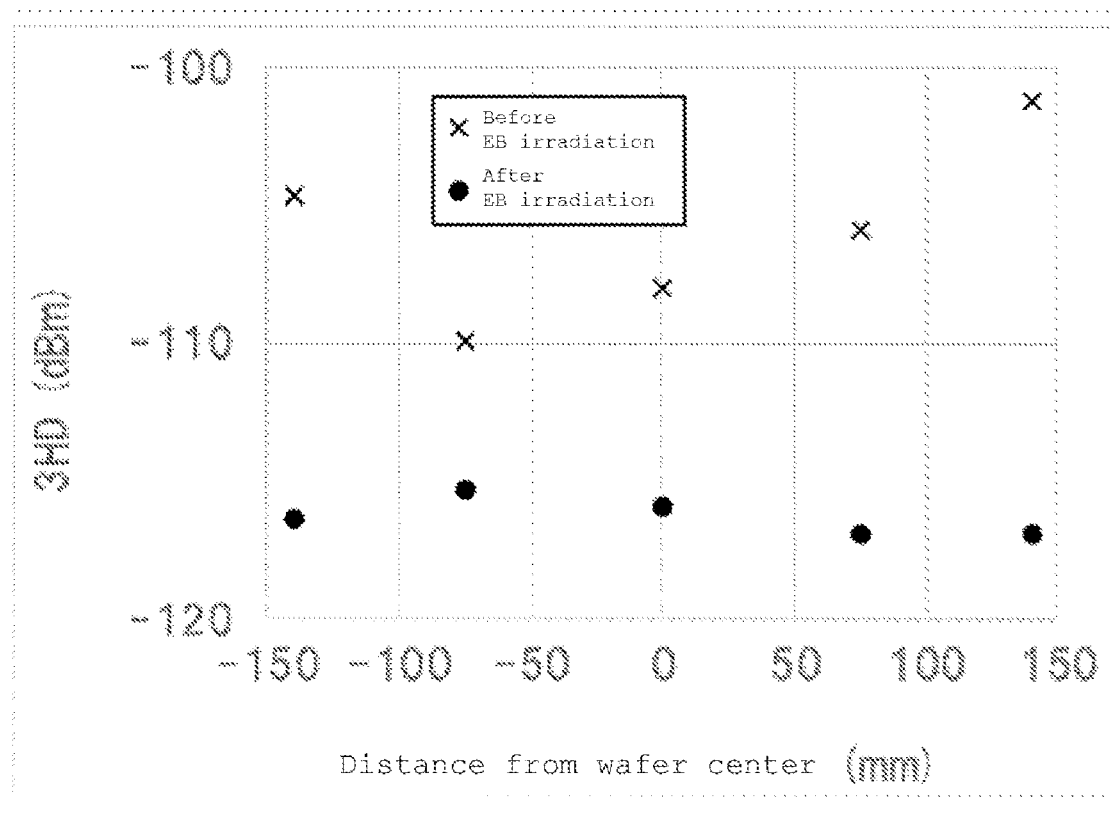

[FIG. 6]
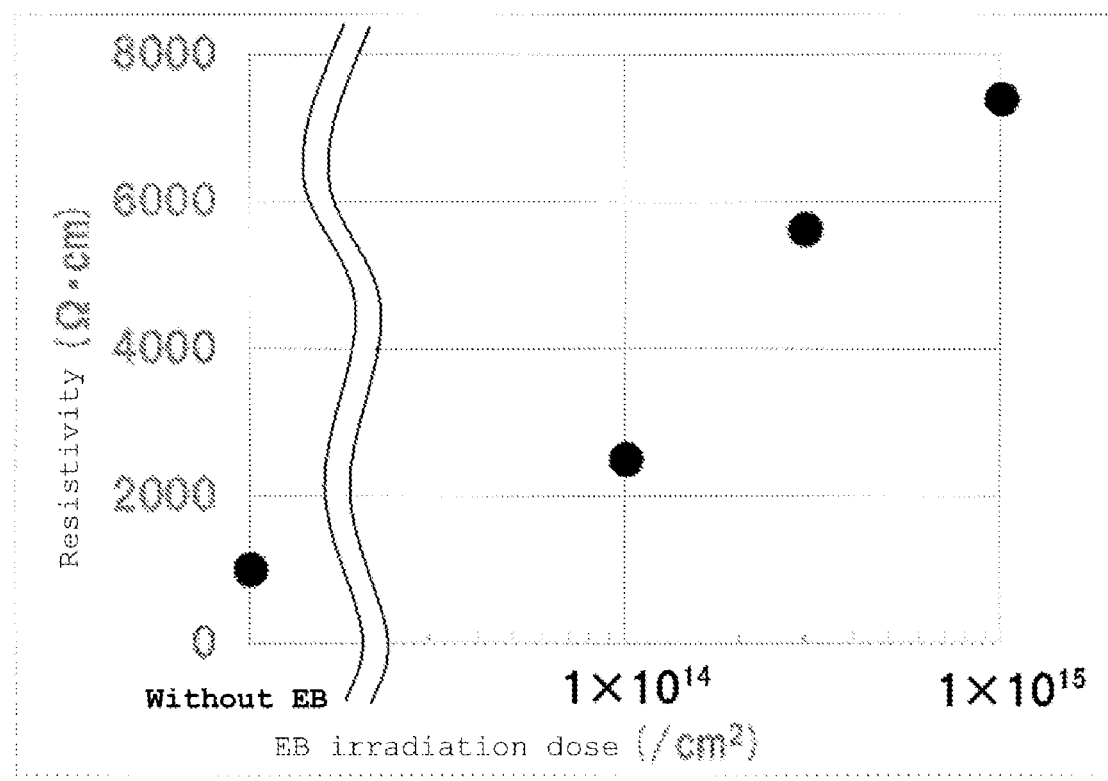

[FIG. 7]
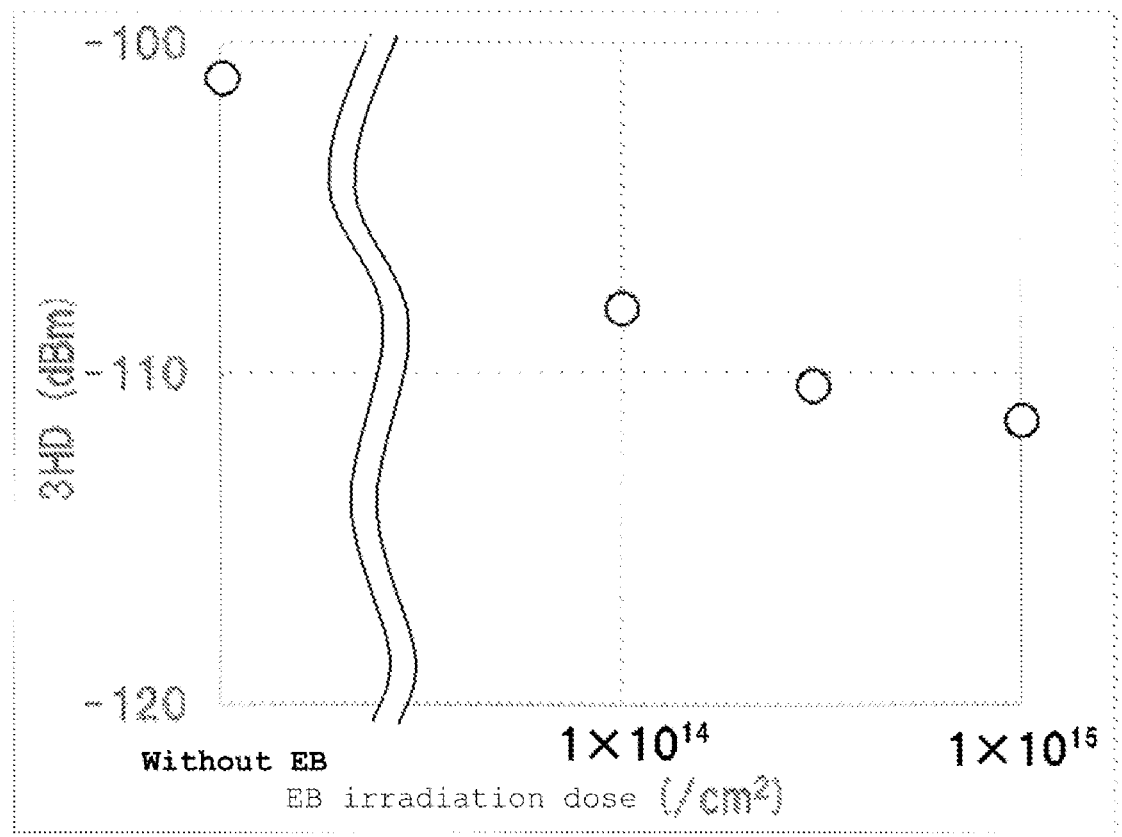

[FIG. 8]
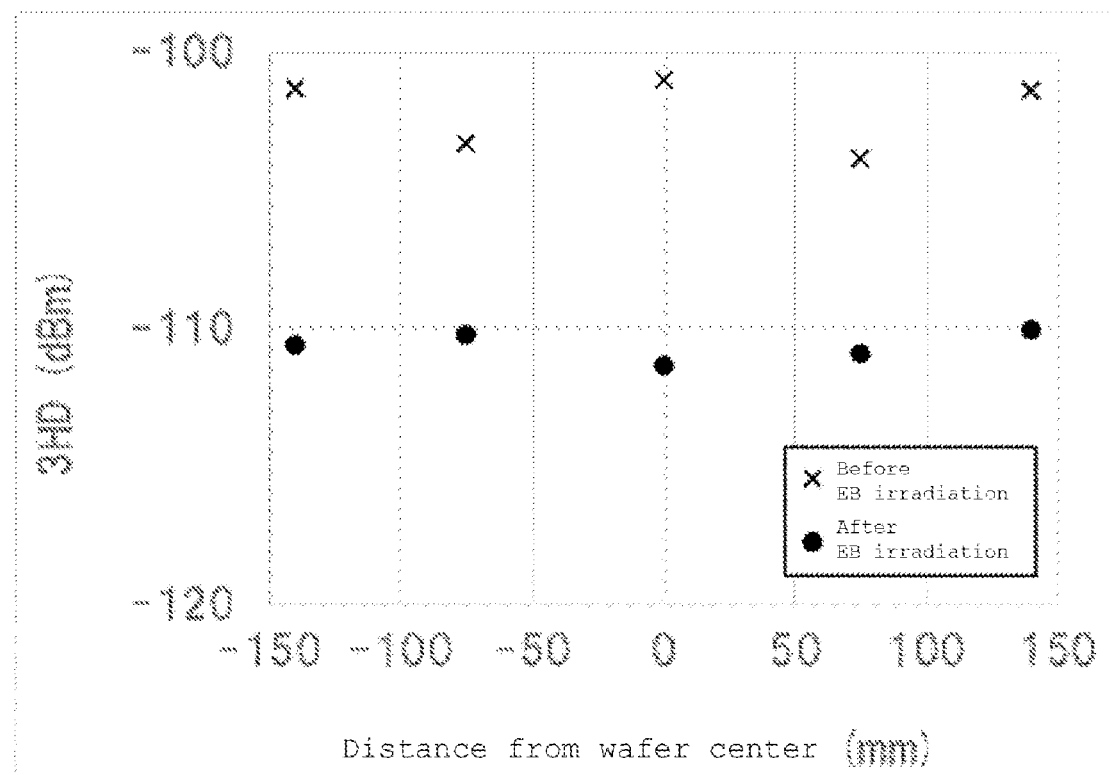

[FIG. 9]
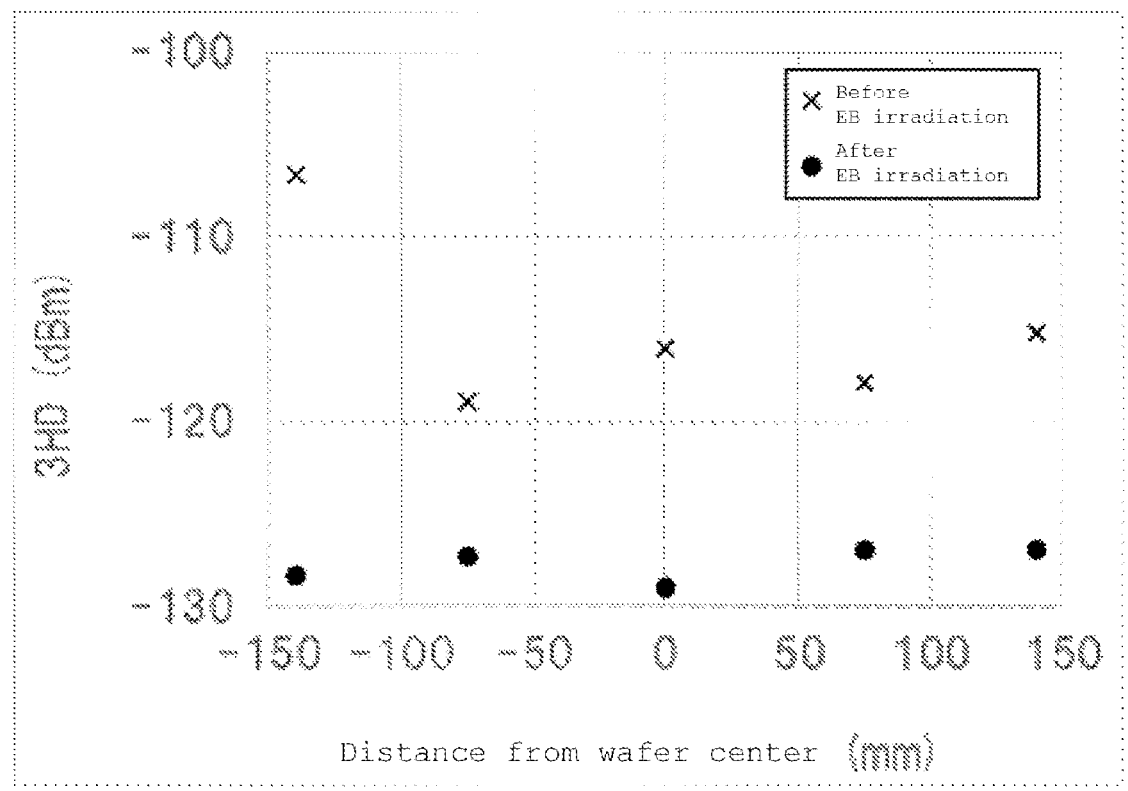
[FIG. 10]
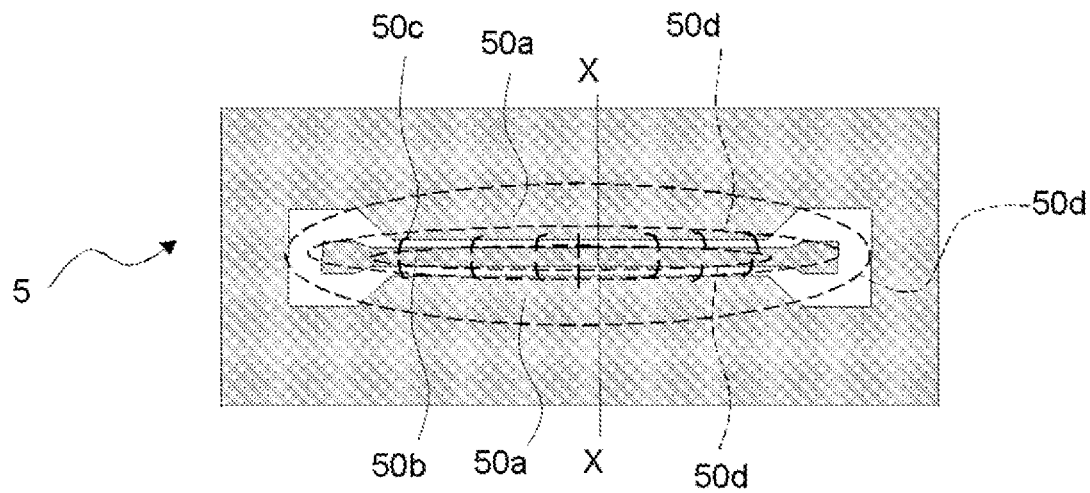

[FIG. 11]
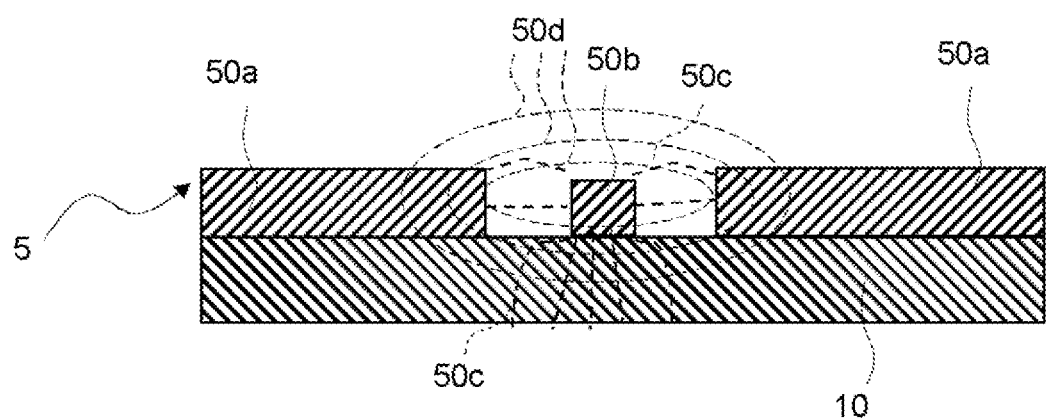

METHOD FOR PRODUCING SEMICONDUCTOR APPARATUS FOR QUANTUM COMPUTER

TECHNICAL FIELD

The present invention relates to a method for producing a semiconductor apparatus for a quantum computer.

BACKGROUND ART

With the arrival at 5G, devices have been required to be compatible with a wide frequency band, and many high-frequency parts, such as a filter. For example, as described in Patent Document 1, in a wireless communication apparatus a device used in a wireless frequency band is mounted on a semiconductor substrate, such as a silicon substrate.

On the other hand, as computers that can solve calculations being too difficult to solve within a realistic time with conventional computers, an expectation of quantum computers, which utilize quantum effects such as superposition and quantum entanglement, is rising. Studies for practical use of this quantum computer have been actively made. Devices used for the quantum computer can be mounted on a semiconductor substrate, such as, for example a silicon substrate.

The device used for the quantum computer utilizes the Josephson effect using superconductors or utilizes electron spin (ESR) for converting a quantum effect into an electric signal to perform writing and reading.

The quantum effect is often written with a coil and a capacitor (LC circuit) in an equivalent circuit, and electric signals for reading and writing necessarily have high frequency.

For example, in a device using a silicon substrate and utilizing electron spin, the electron spin placed in an electromagnetic field is resonated by irradiation of microwave with frequency sweeping to enable to read a quantum effect. As understood from this example, a high-frequency circuit becomes necessary in order to operate a quantum computer device (see Non Patent Document 1).

As described above, even a quantum computer device requires an analog semiconductor technology. In fact, silicon is used as a substrate material in many cases.

Accordingly, a silicon substrate used for a quantum computer device has a premise of operating a high frequency. A non-doped silicon substrate is used, for example.

High-frequency characteristics of such a substrate for the quantum computer include third harmonic (3HD) characteristics measured by forming an insulative film on the substrate and forming a Co-Planar Waveguide (CPW) 5 having an Al electrode on the insulative film, as illustrated in FIGS. 10 and 11.

CPW 5 is referred to a device 5 as the example illustrated in FIG. 10 and FIG. 11. The device 5 has a structure including: metal electrodes 50a arranged in parallel with a gap; and linear central metal electrodes 50b formed at centers of the gap and in parallel to these metal electrodes 50a. The device 5 transmits electromagnetic wave with: electric field 50c directed from the central metal electrodes 50b toward the metal electrodes 50a on both right and left sides in FIG. 11 and inward a semiconductor substrate 10; and a magnetic field 50d directed to surround the central metal electrodes 50b inside the semiconductor substrate 10.

Although a structure of only silicon is typically used as the substrate for a quantum computer, in order to conveniently evaluate the 3HD characteristics, the insulative film is formed and the CPW is further formed thereon to evaluate the 3HD characteristics. Illustration of the insulative film is omitted in FIG. 11.

Here, a higher harmonic is referred to a higher frequency component having an integer multiple frequency of an original frequency. The original frequency is defined as a fundamental wave, a wave having a double frequency (a half wavelength) is defined as 2HD, and a wave having a triple frequency (one-third wavelength) is defined as 3HD. A high-frequency circuit requires a substrate with reduced higher harmonic in order to avoid interference due to a higher harmonic. Among these, the third harmonic characteristics are preferably utilized for evaluating a substrate for a quantum computer device. For an evaluating method of high-frequency signal distortion, second harmonic characteristics, which has a strong signal, are often utilized. This second harmonic is often used for evaluating passive devices, such as a filter and a switch, and their substrate characteristics. Meanwhile, preferably used for evaluating the substrate for a quantum computer device is the third harmonic (3HD). The 3HD is equivalent to a third intermodulation distortion (IMD3), which is an evaluation index of active devices represented by an amplifier. The IMD3 is a so-called noise generated when two adjacent signals having different frequencies are input, and is generated near the signals. Since generated near the major signal, the IMD3 is difficult to be removed with a filter, etc., and thereby the IMD3 is required to be sufficiently reduced in advance at the time of device production. On the other hand, the 2HD, which appears at a position of the double frequency of the major signal and is a signal of a passive device, can be easily removed.

For example, as described in Non Patent Document 2, the 3HD is known to relate to this IMD3 as the following relational expression.

$IMD3 = 3 \times 3HD$ (when linearly represented) $= 3HD + 10$ dB (when expressed in dB)

Note: The above 10 dB is exactly +9.54 dB=20×Log 3.

With the above relationship, the present invention utilizes the 3HD characteristics to observe the IMD3 characteristics.

CITATION LIST

Patent Literature

Patent Document 1: JP 2020-507230 A
Patent Document 2: JP 2005-93939 A
Patent Document 3: JP H10-93107 A
Patent Document 4: JP S51-93666 A
Patent Document 5: JP S51-93684 A
Patent Document 6: JP S51-100644 A

Non Patent Literature

Non Patent Document 1: Rosenberg, D., Kim, D., Das, R. et al. 3D integrated superconducting qubits. npj Quantum Inf 3, 42 (2017).
Non Patent Document 2: Rohde & Schwarz Application Note "Measurement of Harmonics using Spectrum Analyzers"

SUMMARY OF INVENTION

Technical Problem

One of specific solutions to improve the 3HD characteristics described above is increase in a resistivity of a semiconductor substrate.

However, such increase in the resistivity of a semiconductor substrate is extremely difficult. For example, achievement of an electric resistivity of higher than 3000 Ω·cm requires non-doping or, in case of boron, P-type, extremely low dopant concentration of $3 \times 10^{12}$ atoms/cm$^3$. In addition, further increase in the resistivity is difficult due to an effect of an impurity in a raw material.

The present invention has been made to solve the above problem. An object of the present invention is to provide a method for producing a semiconductor apparatus for a quantum computer that can produce a semiconductor apparatus for a quantum computer having excellent 3HD characteristics.

Solution to Problem

To achieve the above object, the present invention provides a method for producing a semiconductor apparatus for a quantum computer, the apparatus comprising: a semiconductor substrate; a quantum computer device formed on the semiconductor substrate; and a peripheral circuit formed on the semiconductor substrate and connected to the quantum computer device and the apparatus being to be used as a quantum computer, the method comprising:

a step of forming the quantum computer device and the peripheral circuit on the semiconductor substrate; and a step of deactivating a carrier in the semiconductor substrate by irradiation of a particle beam to at least a formation part for the quantum computer device and a formation part for the peripheral circuit in the semiconductor substrate.

In such a producing method, the particle beam is irradiated to at least the formation part for the quantum computer device, which is used in the quantum computer region, and the formation part for the peripheral circuit connected to this device in the semiconductor substrate. This irradiation introduces point defects into at least these parts in the semiconductor substrate to allow these point defects to trap carriers, resulting in deactivation of the carrier. This deactivation can increase the resistivity of at least the formation part for the quantum computer device and the formation part for the peripheral circuit in the semiconductor substrate, and consequently can improve the high-frequency characteristics, particularly the 3HD characteristics, of the produced semiconductor apparatus for a quantum computer. That is, the inventive producing method can produce the semiconductor apparatus for a quantum computer having excellent 3HD characteristics.

Preferably, by the irradiation of the particle beam, a resistivity of the formation part for the quantum computer device and a resistivity of the formation part for the peripheral circuit in the semiconductor substrate are made to 3000 Ω·cm or more.

Such irradiation can produce the semiconductor apparatus for a quantum computer having surely excellent 3HD characteristics.

The particle beam can be irradiated to at least the formation part for the quantum computer device and the formation part for the peripheral circuit in the semiconductor substrate before forming the quantum computer device and the peripheral circuit on the semiconductor substrate.

Alternatively, the particle beam may be irradiated to at least the formation part for the quantum computer device and the formation part for the peripheral circuit in the semiconductor substrate after forming the quantum computer device and the peripheral circuit on the semiconductor substrate.

As described above, the particle beam may be irradiated before forming the quantum computer device and the peripheral circuit on the semiconductor substrate, or may be irradiated after the formations.

An electron beam is preferably irradiated as the particle beam.

A case of the electron beam, which is highly penetrative and capable of forming uniform defects over the substrate in the depth direction, is remarkably effective.

Advantageous Effects of Invention

As described above, the inventive method for producing a semiconductor apparatus for a quantum computer can increase the resistivity of at least the formation part for the quantum computer device and the formation part for the peripheral circuit in the semiconductor substrate, and consequently improve the high-frequency characteristics, particularly the 3HD characteristics, of the semiconductor apparatus to be produced for a quantum computer. That is, the inventive producing method can produce the semiconductor apparatus for a quantum computer having excellent 3HD characteristics.

BRIEF DESCRIPTION OF DRAWINGS

FIG. 1 is a schematic perspective view illustrating an example of a semiconductor apparatus for a quantum computer that can be produced by the inventive method for producing a semiconductor apparatus for a quantum computer.

FIG. 2 is a graph indicating a relationship between a substrate resistivity and 3HD characteristics after electron beam irradiation in each of Examples 1 and 2.

FIG. 3 is a graph indicating a relationship between an irradiation dose of an electron beam and a substrate resistivity after electron beam irradiation in Example 1.

FIG. 4, is a graph indicating a relationship between an irradiation dose of an electron beam and 3HD characteristics in Example 1.

FIG. 5 is a graph indicating a change in in-plane distribution of 3HD before and after electron beam irradiation in Example 1.

FIG. 6 is a graph indicating a relationship between an irradiation dose of an electron beam and a substrate resistivity after electron beam irradiation in Example 2.

FIG. 7 is a graph indicating a relationship between an irradiation dose of an electron beam and 3HD characteristics in Example 2.

FIG. 8 is a graph indicating a change in in-plane distribution of 3HD before and after electron beam irradiation in Example 2.

FIG. 9 is a graph indicating a change in in-plane distribution of 3HD of a non-doped substrate before and after electron beam irradiation in Example 3.

FIG. 10 is a schematic plane view of a Co-Planar Waveguide (CPW) of an example used for evaluating third harmonic characteristics.

FIG. 11 is a sectional view of the CPW along a line segment X-X in FIG. 10.

DESCRIPTION OF EMBODIMENTS

As described above, there have been demands for the developments of a method for producing a semiconductor apparatus for a quantum computer that can produce a semiconductor apparatus for a quantum computer having excellent 3HD characteristics.

The present inventors have earnestly studied the above problem and consequently found that irradiating a particle beam to at least a formation part for the quantum computer device and a formation part for the peripheral circuit in a semiconductor substrate introduces point defects into at least these parts in the semiconductor substrate, and these point defects trap carriers in the substrate for deactivating the carrier in the semiconductor substrate to increase a resistivity of at least these parts in the semiconductor substrate, and consequently a semiconductor apparatus for a quantum computer having excellent 3HD characteristics can be produced. This finding has led to the completion of the present invention.

Specifically, the present invention is a method for producing a semiconductor apparatus for a quantum computer, the apparatus comprising: a semiconductor substrate; a quantum computer device formed on the semiconductor substrate; and a peripheral circuit formed on the semiconductor substrate and connected to the quantum computer device, and the apparatus being to be used as a quantum computer, the method comprising:

a step of forming the quantum computer device and the peripheral circuit on the semiconductor substrate; and a step of deactivating a carrier in the semiconductor substrate by irradiation of a particle beam to at least a formation part for the quantum computer device and a formation part for the peripheral circuit in the semiconductor substrate.

In Patent Document 2, an oxidative treatment such as irradiation of an electron beam is performed for increasing a resistivity of a low-resistant layer to prevent a side-leak current.

Patent Document 3 describes that irradiating a charged particle beam to a high-resistant GaAs substrate to partially increase a resistivity.

Patent Documents 4 to 6 describe that irradiating a high-energy electron beam can selectively make inner region of a semiconductor insulative or have a high resistivity.

However, these documents does not describe nor suggest irradiating a particle beam to each formation part for the quantum computer device and the peripheral circuit to deactivate carriers in a method for producing a semiconductor apparatus used for a quantum computer.

Hereinafter, the present invention will be described in detail with reference to the drawings, but the present invention is not limited thereto.

First, an example of the semiconductor apparatus for a quantum computer that can be produced by the inventive method for producing a semiconductor apparatus for a quantum computer will be described with reference to FIG. 1. Should be noted that the semiconductor apparatus for a quantum computer that can be produced by the inventive producing method is not limited to the example illustrated in FIG. 1.

A semiconductor apparatus for a quantum computer 10 illustrated in FIG. 1 includes: a semiconductor substrate 1; a quantum computer device 2 and a peripheral circuit 3 thereof which are formed on the semiconductor substrate 1. The peripheral circuit 3 is connected to the quantum computer device 2. A connection form between the quantum computer device 2 and the peripheral circuit 3 is not particularly limited. In FIG. 1, illustration of the connection between the quantum computer device 2 and the peripheral circuit 3 is omitted.

The quantum computer device 2 is not particularly limited as long as it is a device used for a quantum computer.

The quantum computer device 2 is formed in a formation part 12 for the quantum computer device in the semiconductor substrate 1. Herein, a part where the quantum computer device 2 is formed in the semiconductor substrate 1 and a part where the quantum computer device 2 is planned to be formed in the semiconductor substrate 1 are collectively referred to as the formation part 12 for the quantum computer device.

The peripheral circuit 3 is not particularly limited as long as it is to be connected to the quantum computer device 2.

The peripheral circuit 3 is formed in a formation part 13 for the peripheral circuit in the semiconductor substrate 1. Herein, a part where the peripheral circuit 3 is formed in the semiconductor substrate 1 and a part where the peripheral circuit 3 is planned to be formed in the semiconductor substrate 1 are collectively referred to as the formation part 13 for the peripheral circuit.

The inventive method for producing a semiconductor apparatus for a quantum computer includes a step of deactivating a carrier in the semiconductor substrate 1 by irradiation of a particle beam to at least the formation part 12 for the quantum computer device and the formation part 13 for the peripheral circuit in the semiconductor substrate 1.

Although not wishing to be bound by theory, it is considered that in the deactivation herein, by irradiating a particle beam, point defects are formed in the semiconductor substrate 1, for example, in a silicon substrate, to allow these defects to serve as carrier traps to trap carriers in the semiconductor substrate 1, and consequently the semiconductor substrate 1 has a higher resistivity. When the irradiated particle beam is an electron beam, which is highly penetrative, uniform defects can be formed over the substrate in the depth direction, and thereby it is remarkably effective.

It is considered that such reduction in a carrier (increase in the resistivity) eliminates a carrier following the high frequency to decrease the high harmonic when the high frequency is applied Although not limited, a particle beam, such as an electron beam, is irradiated to a formation part for an active device in the formation part 12 for the quantum computer device to remarkably yield the effect by deactivating the carriers such as dopants and/or impurities derived from a raw material in the semiconductor substrate 1. This is because the IMD3 (equivalent to 3HD), which is generated near the major signal, is difficult to be removed with a filter, etc., and predetermined characteristics can only be imparted in an initial stage, and thereby the predetermined characteristics are required to be imparted as much as possible in the initial stage.

The particle beam may be irradiated to the entire surface of the semiconductor substrate 1 on which the quantum computer device 2 and the peripheral circuit 3 are formed. In this case, the particle beam can be irradiated without considering a formation position of the quantum computer device 2 and the peripheral circuit 3, resulting in further convenience.

The electron beam, which is more commonly used for lifetime regulation of power devices than other particle beams, has many advantages including high penetration ability and capability of uniform irradiation in the depth direction of the semiconductor substrate 1. Thus, the electron beam is preferably irradiated as the particle beam.

In this time, by irradiating the particle beam to make a resistivity of the formation part 12 for the quantum computer device and a resistivity of the formation part 13 for the peripheral circuit 13 in the semiconductor substrate 1 to 3000 Ω·cm or more, the semiconductor apparatus for a quantum computer 10 having further excellent 3HD characteristics can be produced.

Since a higher resistivity of the formation part 12 for the quantum computer device and a higher resistivity of the formation part 13 for the peripheral circuit in the semiconductor substrate 1 is more preferable, the upper limit is not limited. The resistivity can be, for example, 100,000 Ω·cm or less.

Furthermore, the irradiation of the particle beam, for example the electron beam, may be performed any of before and after producing the quantum computer device 2 and the peripheral circuit 3, and can be selected depending on a process and characteristics of the device. That is, the particle beam can be irradiated to at least the formation part 12 for the quantum computer device and the formation part 13 for the peripheral circuit in the semiconductor substrate 1 before forming the quantum computer device 2 and the peripheral circuit 3 on the semiconductor substrate 1. Alternatively, the particle beam can be irradiated to at least the formation part 12 for the quantum computer device and the formation part 13 for the peripheral circuit in the semiconductor substrate 1 after forming the quantum computer device 2 and the peripheral circuit 3 on the semiconductor substrate 1.

When the electron beam is irradiated, an irradiation dose of the electron beam is not particularly limited. A larger irradiation dose leads a higher resistivity, and the 3HD characteristics are further improved. The irradiation dose can be determined depending on, for example, a resistivity of the used semiconductor substrate 1 (resistivity before the irradiation of the particle beam) and a target value of the 3HD characteristics.

For example, the irradiation dose of the electron beam can be $1\times10^{14}$ to $1\times10^{16}/cm^2$. Such an irradiation of the electron beam can lead a resistivity of the formation part 12 for the quantum computer device and the formation part 13 for the peripheral circuit in the semiconductor substrate 1 to 3000 Ω·cm or more to obtain excellent 3HD characteristics.

When at least the resistivity of the formation part 12 for the quantum computer device and the resistivity of the formation part 13 for the peripheral circuit in the semiconductor substrate 1 is increased by the present invention, a semiconductor apparatus having better high-harmonic characteristics, particularly 3HD characteristics, than conventional devices can be produced. In addition, the resistivity can be increased even with a substrate having a relatively low resistivity. When a non-doped substrate is used, by deactivation of an impurity carrier derived from a raw material, the resistivity can further be improved and in-plane resistivity distribution caused by a solid-liquid boundary shape during the crystal growth can be improved.

The 3HD characteristics are also affected by in-plane resistivity variation of the semiconductor substrate 1. In the present invention, the irradiation of the particle beam, for example the electron beam, can also reduce the in-plane resistivity variation of the support substrate, and thereby the excellent 3HD characteristics can be obtained.

In the inventive method for producing a semiconductor apparatus for a quantum computer, a step of forming the quantum computer device and its peripheral circuit on the semiconductor substrate is not particularly limited, and can be appropriately selected depending on the device to be formed on the semiconductor substrate.

EXAMPLES

Hereinafter, the present invention will be specifically described by using Examples and Comparative Examples, but the present invention is not limited thereto.

Example 1

Provided was a boron-doped high-resistivity silicon single-crystal substrate (resistivity of 5000 Ω·cm) produced by the CZ method and having a diameter of 300 mm. To an entirety of this substrate, an electron beam was irradiated (acceleration energy: 2 MeV, dose: $1\times10^{14}$ to $1\times10^{15}/cm^2$). Then, a substrate resistivity was measured by the spreading resistance (SR) method. FIG. 3 shows the measurement results. From the results shown in FIG. 3, it has been found that a larger irradiation dose of the electron beam leads a higher substrate resistivity.

Thereafter, a substrate for evaluation was produced by the following procedure. First, another substrate having the same resistivity as the above was provided. On a surface of this substrate, an oxide film having a thickness of 400 nm was formed by plasma CVD. Then, produced were devices in which CPW 5 (line length: 2200 μm) being an aluminum electrode and having the same structure as illustrated in FIG. 10 was formed at positions of: a central part; middle parts in the radius direction (positions with 75 mm from the center into the radius direction: four positions); and outer peripheral parts (positions with 140 mm from the center into the radius direction: four positions) on this substrate. Thereafter, an electron beam was irradiated to the substrate on which these devices were formed to produce a substrate for evaluation of Example 1. The electron beam was irradiated to each device formed on the central part in the radius direction with the substrate spinning. During the electron beam radiation, the irradiation dose was stepwise changed from $1\times10^{14}$ to $1\times10^{15}/cm^2$. With each device formed on the central part and outer peripheral part on the substrate, the electron beam was irradiated at an irradiation dose of $1\times10^{15}/cm^2$.

Then, measured were third harmonic characteristics (3HD characteristics) (frequency: 1 GHz, input power: 15 dBm) of each device of the substrate for evaluation of Example 1. FIG. 4 shows the measurement results. As a result, it has been found that the 3HD characteristics of the devices formed on the substrate depend on the irradiation dose of the electron beam, and a larger irradiation dose of the electron beam can improve the 3HD characteristics.

In addition, compared were variation of the measurement results of the 3HD characteristics in the wafer diameter direction before and after the irradiation of the electron beam at $1\times10^{15}/cm^2$ with the five devices formed on the central part, the middle parts in the radius direction, and the outer peripheral parts on this substrate. FIG. 5 shows the results. From the results shown in FIG. 5, it has been found that the electron beam irradiation not only improves the 3HD characteristics but also improves the variation of the in-plane 3HD characteristics.

Example 2

Provided was a boron-doped high-resistivity silicon single-crystal substrate (resistivity of 1000 Ω·cm) produced by the CZ method and having a diameter of 300 mm. To an entirety of this substrate, an electron beam was irradiated (acceleration energy: 2 MeV, dose: $1\times10^{14}$ to $1\times10^{15}/cm^2$). Then, a substrate resistivity was measured by the SR method. FIG. 6 shows the measurement results. From the results shown in FIG. 6, it has been found that a larger irradiation dose of the electron beam leads a higher substrate resistivity.

Thereafter, a substrate for evaluation was produced by the following procedure. First, another substrate having the same resistivity as the above was prepared. On a surface of this substrate, an oxide film having a thickness of 400 nm was formed by plasma CVD. Then, produced were devices in which CPW 5 (line length: 2200 μm) being an aluminum electrode and having the same structure as illustrated in FIG. 10 was formed at positions of: a central part; middle parts in the radius direction (positions with 75 mm from the center into the radius direction: four positions); and outer peripheral parts (positions with 140 mm from the center into the radius direction: four positions) on this substrate. Thereafter, an electron beam was irradiated to the substrate on which these devices were formed to produce a substrate for evaluation of Example 2. The electron beam was irradiated to each device formed on the central part in the radius direction with the substrate spinning. During the electron beam radiation, the irradiation dose was stepwise changed from $1 \times 10^{14}$ to $1 \times 10^{15}/cm^2$. With each device formed on the central part and outer peripheral part on the substrate, the electron beam was irradiated at an irradiation dose of $1 \times 10^{15}/cm^2$.

Then, measured were third harmonic characteristics (3HD characteristics) (frequency: 1 GHz, input power: 15 dBm) of each device of the substrate for evaluation of Example 2. FIG. 7 shows the measurement results. As a result, it has been found that the 3HD characteristics of the devices formed on the substrate depend on the irradiation dose of the electron beam, and a larger irradiation dose of the electron beam can improve the 3HD characteristics.

In addition, compared were variation of the measurement results of the 3HD characteristics in the wafer diameter direction before and after the irradiation of the electron beam at $1 \times 10^{15}/cm^2$ with the five devices formed on the central part, the middle parts in the radius direction, and the outer peripheral parts on this substrate. FIG. 8 shows the results. From the results shown in FIG. 8, it has been found that the electron beam irradiation not only improves the 3HD characteristics but also improves the variation of the in-plane 3HD characteristics.

FIG. 2 summarizes the results of the above Examples 1 and 2. From the results shown in FIG. 2, it is found that a larger irradiation dose of the electron beam increases the resistivity to improve the 3HD characteristics. In particular, by making a substrate resistivity after the electron beam irradiation 3000 Ω·cm or more, the device having the excellent 3HD characteristics can be formed.

Example 3

Provided was a non-doped high-resistivity silicon single-crystal substrate (P-type, resistivity of 20000 Ω·cm) produced by the CZ method and having a diameter of 300 mm. On a surface of this substrate, an oxide film having a thickness of 400 nm was formed by plasma CVD. Then, produced were devices in which CPW 5 (line length: 2200 μm) being an aluminum electrode and having the same structure as illustrated in FIG. 10 was formed at positions of: a central part; middle parts in the radius direction (positions with 75 mm from the center into the radius direction: four positions); and outer peripheral parts (positions with 140 mm from the center into the radius direction: four positions) on this substrate. Thereafter, an electron beam was irradiated (acceleration energy: 2 MeV, dose: $1 \times 10^{15}/cm^2$) to an entirety of the substrate to produce a substrate for evaluation of Example 3.

Measured were third harmonic characteristics (3HD characteristics) (frequency: 1 GHz, input power: 15 dBm) of the five devices formed on the central part, the middle parts in the radius direction, and the outer peripheral parts on the substrate to measure in-plane distribution of the 3HD characteristics of the substrate for evaluation of Example 3.

Since the resistivity after the electron beam irradiation cannot be measured by the SR, it was determined by extrapolation from the relationship between the irradiation dose of the electron beam and the resistivity. As a result, the resistivity of the substrate for evaluation after the electron beam irradiation was approximately 50000 Ω·cm. That is, the electron beam irradiation was capable of increasing the resistivity of the non-doped silicon.

Meanwhile, a similar substrate without electron beam irradiation was provided to measure in-plane distribution of 3HD characteristics of this substrate. FIG. 9 shows the measurement results of the in-plane substrate of the 3HD with and without the electron beam irradiation. From the results shown in FIG. 9, it has been found that the electron beam irradiation not only improves the 3HD characteristics but also improves the variation of the in-plane 3HD characteristics.

From the results shown above, it is found that even the semiconductor device for a quantum computer produced with changing the device having the CWP in the substrate for evaluation of Examples 1 to 3 to the quantum computer device and its peripheral circuit can exhibit the excellent 3HD characteristics similar to that of the substrate for evaluation of Examples 1 to 3.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for producing a semiconductor apparatus for a quantum computer, the apparatus comprising: a semiconductor substrate; a quantum computer device formed on the semiconductor substrate; and a peripheral circuit formed on the semiconductor substrate and connected to the quantum computer device and the apparatus being to be used as a quantum computer, the method comprising:
   a step of forming the quantum computer device and the peripheral circuit on the semiconductor substrate; and
   a step of deactivating a carrier in the semiconductor substrate by irradiation of a particle beam to at least a formation part for the quantum computer device and a formation part for the peripheral circuit in the semiconductor substrate.

2. The method for producing a semiconductor apparatus for a quantum computer according to claim 1, wherein by the irradiation of the particle beam, a resistivity of the formation part for the quantum computer device and a resistivity of the formation part for the peripheral circuit in the semiconductor substrate are made to 3000 Ω·cm or more.

3. The method for producing a semiconductor apparatus for a quantum computer according to claim 1, wherein the particle beam is irradiated to at least the formation part for the quantum computer device and the formation part for the peripheral circuit in the semiconductor substrate before forming the quantum computer device and the peripheral circuit on the semiconductor substrate.

4. The method for producing a semiconductor apparatus for a quantum computer according to claim 2, wherein the particle beam is irradiated to at least the formation part for the quantum computer device and the formation part for the peripheral circuit in the semiconductor substrate before forming the quantum computer device and the peripheral circuit on the semiconductor substrate.

5. The method for producing a semiconductor apparatus for a quantum computer according to claim 1, wherein the particle beam is irradiated to at least the formation part for the quantum computer device and the formation part for the peripheral circuit in the semiconductor substrate after forming the quantum computer device and the peripheral circuit on the semiconductor substrate.

6. The method for producing a semiconductor apparatus for a quantum computer according to claim 2, wherein the particle beam is irradiated to at least the formation part for the quantum computer device and the formation part for the peripheral circuit in the semiconductor substrate after forming the quantum computer device and the peripheral circuit on the semiconductor substrate.

7. The method for producing a semiconductor apparatus for a quantum computer according to claim 1, wherein an electron beam is irradiated as the particle beam.

8. The method for producing a semiconductor apparatus for a quantum computer according to claim 2, wherein an electron beam is irradiated as the particle beam.

9. The method for producing a semiconductor apparatus for a quantum computer according to claim 3, wherein an electron beam is irradiated as the particle beam.

10. The method for producing a semiconductor apparatus for a quantum computer according to claim 4, wherein an electron beam is irradiated as the particle beam.

11. The method for producing a semiconductor apparatus for a quantum computer according to claim 5, wherein an electron beam is irradiated as the particle beam.

12. The method for producing a semiconductor apparatus for a quantum computer according to claim 6, wherein an electron beam is irradiated as the particle beam.

* * * * *